US009018103B2

(12) United States Patent
Guha et al.

(10) Patent No.: US 9,018,103 B2
(45) Date of Patent: Apr. 28, 2015

(54) HIGH ASPECT RATIO ETCH WITH COMBINATION MASK (71) Applicant: Lam Research Corporation, Fremont, CA (US)

(72) Inventors: Joydeep Guha, Fremont, CA (US); Sirish K. Reddy, Hillsboro, OR (US); Kaushik Chattopadhyay, San Jose, CA (US); Thomas W. Mountsier, San Jose, CA (US); Aaron Eppler, Fremont, CA (US); Thorsten Lill, Santa Clara, CA (US); Vahid Vahedi, Fremont, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/038,388

(22) Filed: Sep. 26, 2013

(65) Prior Publication Data

US 2015/0087154 A1   Mar. 26, 2015

(51) Int. Cl.
*H01L 21/302* (2006.01)
*H01L 21/308* (2006.01)

(52) U.S. Cl.
CPC ........ *H01L 21/3083* (2013.01); *H01L 21/3081* (2013.01)

(58) Field of Classification Search
CPC .............. H01L 21/32; H01L 21/32136; H01L 21/3081; H01L 21/31144; H01L 21/32139
USPC ......... 438/706, 710, 714, 717, 725, 734, 735, 438/736, 743, 740, 716; 216/41, 49, 81
See application file for complete search history.

(56) References Cited

U.S. PATENT DOCUMENTS

| | | | |
|---|---|---|---|
| 6,187,688 B1 * | 2/2001 | Ohkuni et al. | 438/725 |
| 7,432,194 B2 * | 10/2008 | Chou et al. | 438/636 |
| 2007/0148966 A1 * | 6/2007 | Baks et al. | 438/638 |
| 2008/0102619 A1 * | 5/2008 | Lee | 438/594 |
| 2010/0203733 A1 * | 8/2010 | Kanegae et al. | 438/694 |
| 2010/0213446 A1 | 8/2010 | Zhang et al. | |

* cited by examiner

*Primary Examiner* — Lan Vinh
(74) *Attorney, Agent, or Firm* — Beyer Law Group LLP (57) ABSTRACT A method for etching features in a stack is provided. A combination hardmask is formed by forming a first hardmask layer comprising carbon or silicon oxide over the stack, forming a second hardmask layer comprising metal over the first hardmask layer, and patterning the first and second hardmask layers. The stack is etched through the combination hardmask.

16 Claims, 9 Drawing Sheets

HIGH ASPECT RATIO ETCH WITH COMBINATION MASK

BACKGROUND OF THE INVENTION

The present invention relates to the formation of semiconductor devices. More specifically, the invention relates to the etching of high aspect ratio features for semiconductor devices.

During semiconductor wafer processing, in 3D flash memory devices, multiple cells are stacked up together in chain format to save space and increase packing density.

SUMMARY OF THE INVENTION

To achieve the foregoing and in accordance with the purpose of the present invention, a method for etching features in a stack is provided. A combination hardmask is formed by forming a first hardmask layer comprising carbon or silicon oxide over the stack, forming a second hardmask layer comprising metal over the first hardmask layer, and patterning the first and second hardmask layers. The stack is etched through the combination hardmask.

In another manifestation of the invention, a method for etching features in a stack is provided. A combination hardmask is formed by forming a first hardmask layer comprising carbon or silicon oxide over the stack, forming a second hardmask layer comprising metal over the first hardmask layer, and forming a patterned mask over the second hardmask layer. The second hardmask layer is etch through the patterned mask by flowing a second hardmask layer etch gas comprising a halogen component, forming the second hardmask layer etch gas into a plasma, and stopping the flow of the second hardmask layer etch gas. The first hardmask layer is etched by flowing a first hardmask layer etch gas comprising oxygen and at least one of COS or $SO_2$, forming the first hardmask layer etch gas into a plasma, and stopping the flow of the first hardmask layer etch gas. The stack is etched through the combination hardmask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
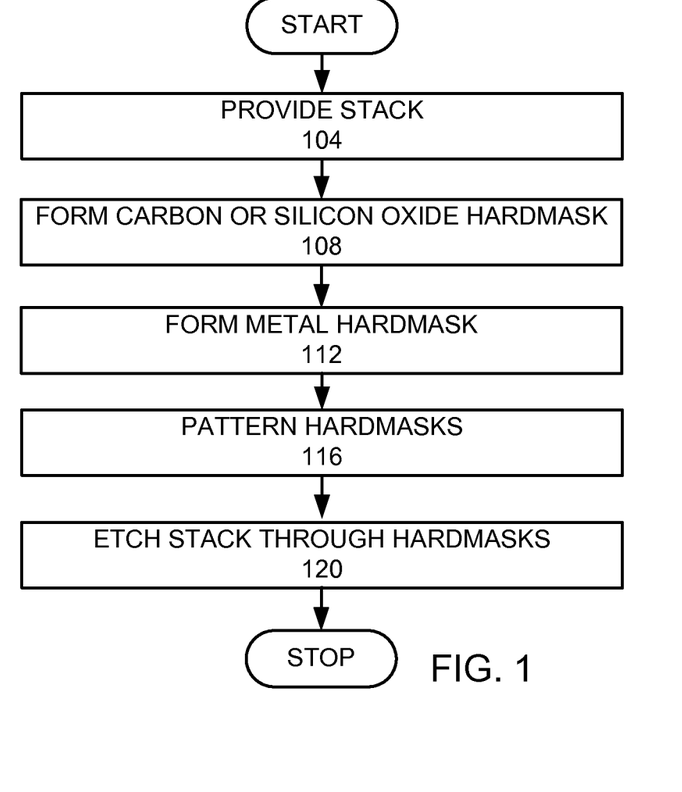
FIG. 1 is a high level flow chart of a process that may be used in an embodiment of the invention.

To facilitate understanding, FIG. 1 is a high level flow chart of a process that may be used in an embodiment of the invention. A stack is provided (step 104). A carbon or silicon oxide containing hardmask is formed over the stack (step 108). A metal containing hardmask is formed over the carbon or silicon oxide containing hardmask (step 112). The carbon or silicon oxide containing hardmask and the metal containing hardmask are patterned (step 116). The stack is etched through the patterned hardmasks (step 120). Patterned hardmasks may include a combination of BARC/DARC/carbon or SiO2.

Example

Figure 2A:
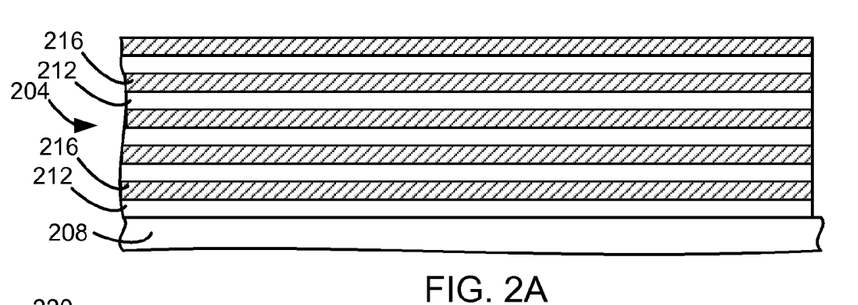
FIGS. 2A-G are schematic cross-sectional views of a memory stack formed according to an embodiment of the invention.

A stack is provided (step 104). In an example of an implementation of the invention, 3D memory array is etched. In such a memory array, memory stacks are formed over a wafer. FIG. 2A is a cross sectional view of a plurality of layers of a stack 204 formed over a wafer 208. One or more layers may be disposed between the stack 204 and the wafer 208. In this embodiment, the stack 204 is a plurality of memory stacks, which are formed by bilayers of a layer of silicon oxide ($SiO_2$) 216 on top of a layer of polysilicon 212.

Figure 2B:
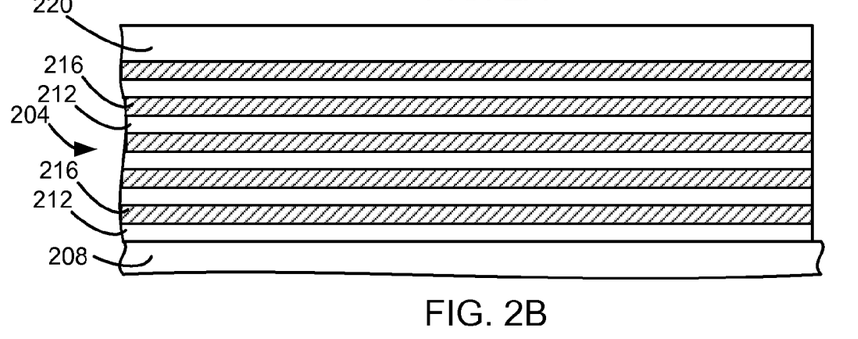

A carbon or silicon oxide hardmask is formed over the stack 204 (step 108). FIG. 2B is a cross sectional view of the stack 204 after a carbon or silicon oxide containing hardmask 220 is formed over the stack 204. In this embodiment, the carbon or silicon oxide containing hardmask 220 is amorphous carbon.

Figure 2C:
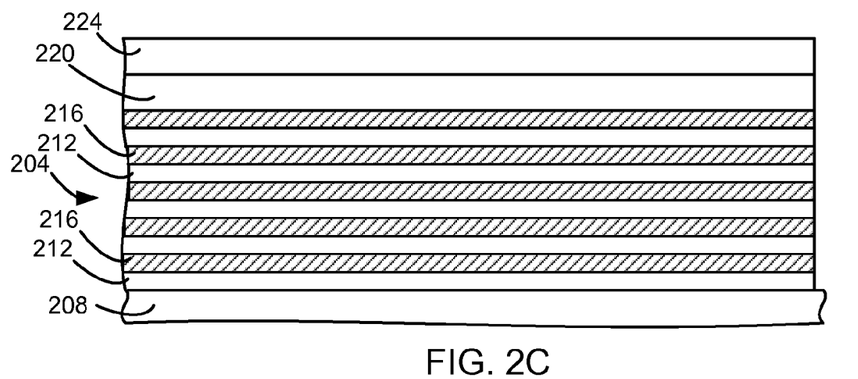

A metal containing hardmask is formed over the carbon or silicon oxide containing hardmask (step 112). FIG. 2C is a cross sectional view of the stack 204 after a metal containing hardmask 224 is formed over the carbon or silicon oxide containing hardmask 220. In this example, the metal containing hardmask 224 is titanium nitride (TiN).

Figure 2D:
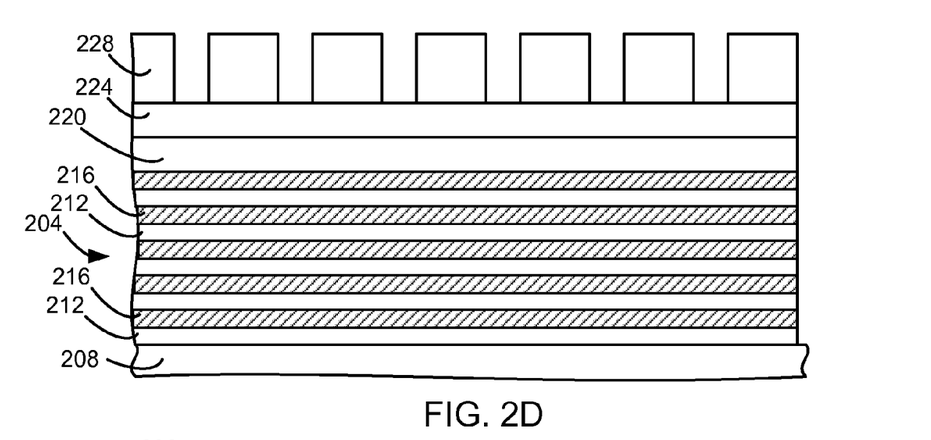
Figure 3:
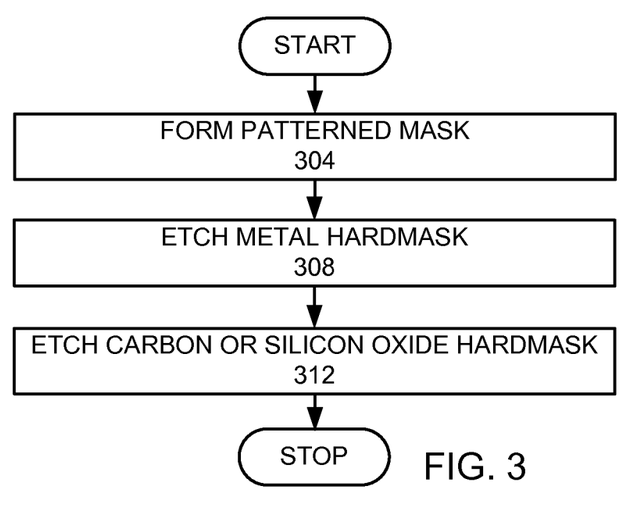
FIG. 3 is a more detailed flow chart of a process of patterning the hardmasks that may be used in an embodiment of the invention.

The hardmasks are patterned (step 116). FIG. 3 is a flow chart of a process for patterning the hardmask used in this embodiment of the invention. A patterned mask is formed over the metal containing hardmask (step 304). FIG. 2D is a cross sectional view of the stack 204 after a patterned mask 228 has been formed over the metal containing hardmask 224. In this example, the patterned mask 228 is formed from silicon nitride (SiN).

Figure 4:
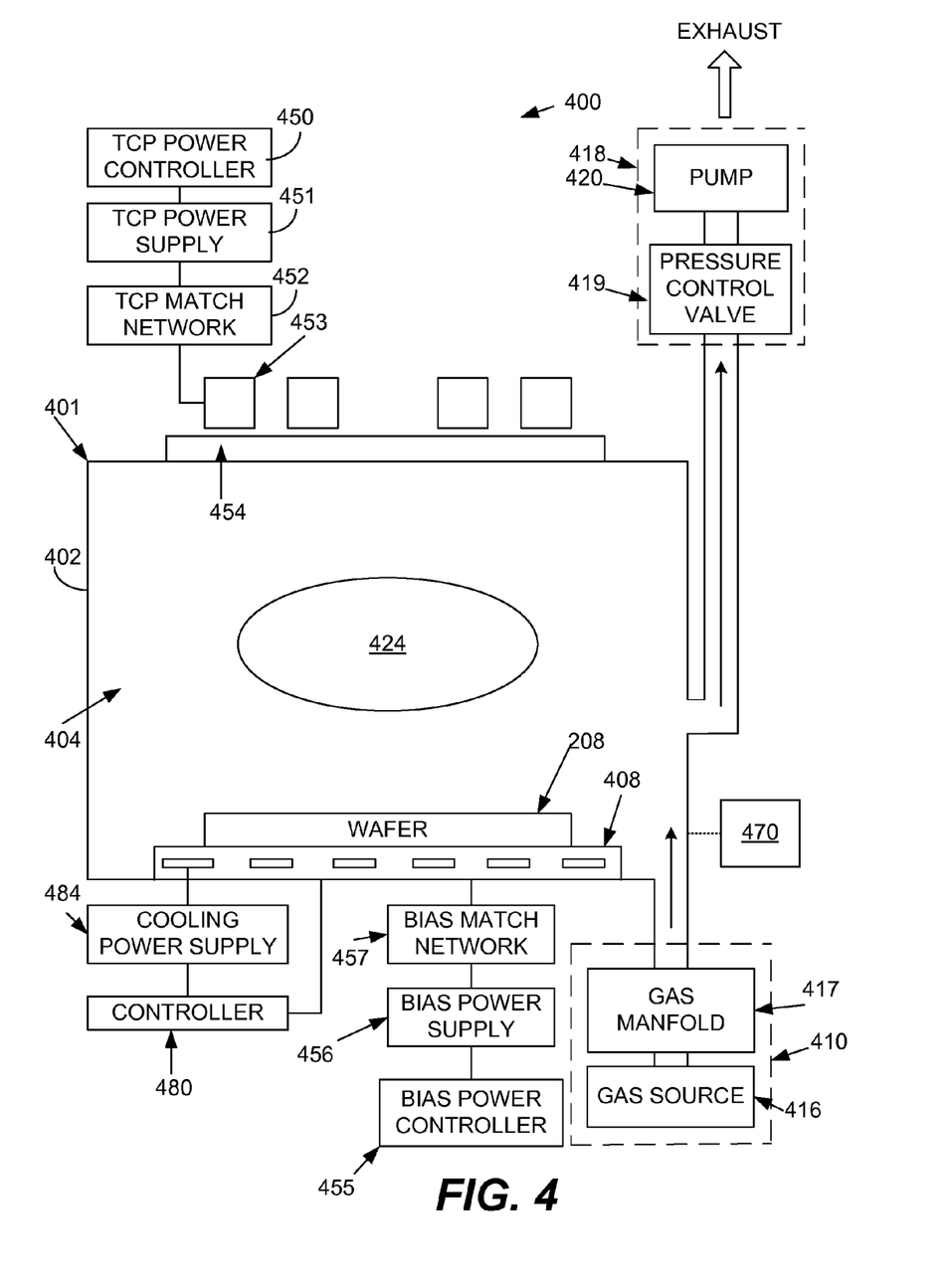
FIG. 4 is a schematic view of a processing chamber that may be used in practicing the invention.

The stack 204 may be placed in a processing tool to perform subsequent steps. FIG. 4 is a schematic view of a plasma processing system 400, including a plasma processing tool 401. The plasma processing tool 401 is an inductively coupled plasma etching tool and includes a plasma reactor 402 having a plasma processing chamber 404 therein. A transformer coupled power (TCP) controller 450 and a bias power controller 455, respectively, control a TCP supply 451 and a bias power supply 456 influencing the plasma 424 created within plasma processing chamber 404.

The TCP controller 450 sets a set point for TCP supply 451 configured to supply a radio frequency signal at 13.56 MHz, tuned by a TCP match network 452, to a TCP coil 453 located near the plasma processing chamber 404. An RF transparent window 454 is provided to separate TCP coil 453 from plasma processing chamber 404, while allowing energy to pass from TCP coil 453 to plasma processing chamber 404.

The bias power controller 455 sets a set point for bias power supply 456 configured to supply an RF signal, tuned by bias match network 457, to a chuck electrode 408 located within the plasma processing chamber 404 creating a direct current (DC) bias above electrode 408 which is adapted to receive the wafer 208, being processed.

A gas supply mechanism or gas source 410 includes a source or sources of gas or gases 416 attached via a gas manifold 417 to supply the proper chemistry required for the process to the interior of the plasma processing chamber 404. A gas exhaust mechanism 418 includes a pressure control valve 419 and exhaust pump 420 and removes particles from within the plasma processing chamber 404 and maintains a particular pressure within plasma processing chamber 404.

A temperature controller 480 controls the temperature of a cooling recirculation system provided within the chuck electrode 408 by controlling a cooling power supply 484. The plasma processing system also includes electronic control circuitry 470. The plasma processing system 400 may also have an end point detector. An example of such an inductively coupled system is the Kiyo built by Lam Research Corporation of Fremont, Calif., which is used to etch silicon, polysilicon and conductive layers, in addition to dielectric and organic materials. In other embodiments of the invention, a capacitively coupled system may be used.

Figure 5:
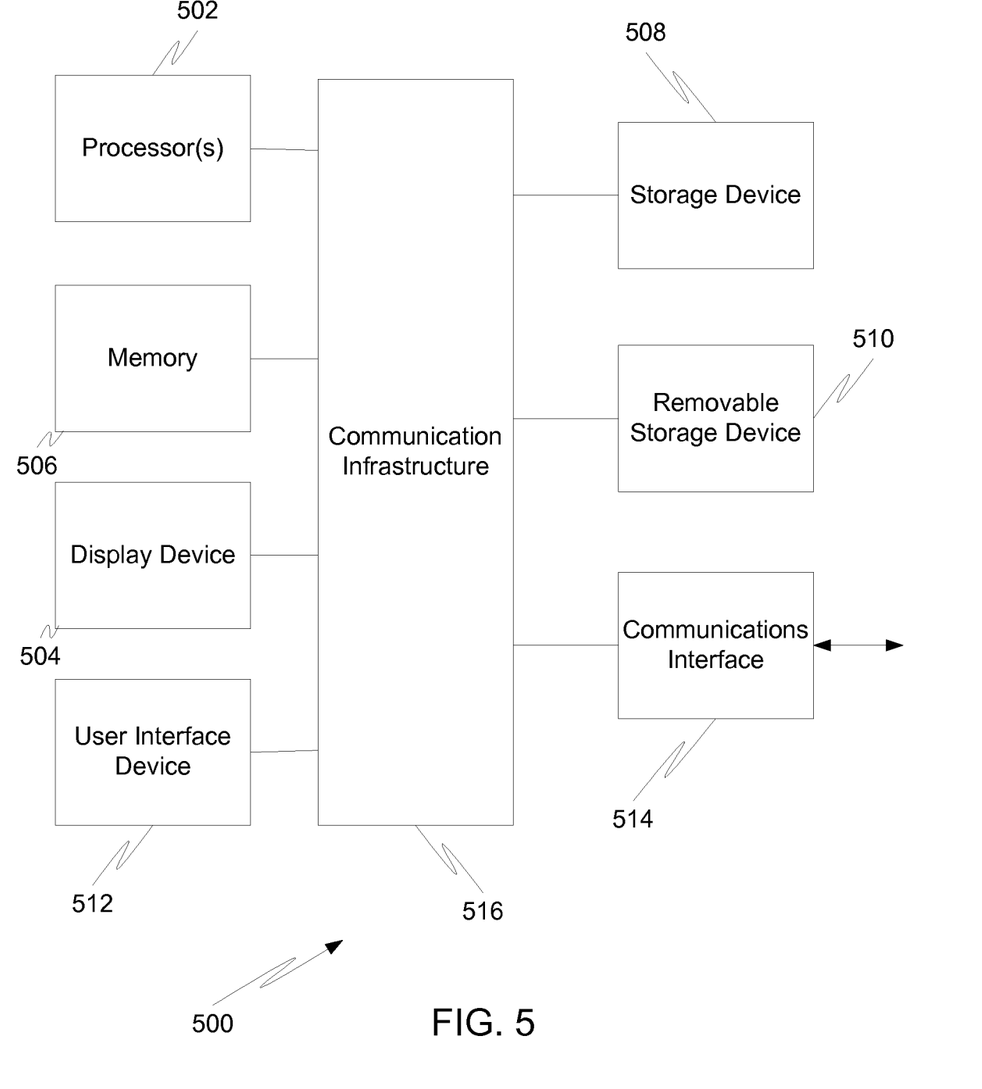
FIG. 5 illustrates a computer system, which is suitable for implementing a controller used in embodiments of the present invention.

FIG. 5 is a high level block diagram showing a computer system 500, which is suitable for implementing a controller used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, crossover bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2E:
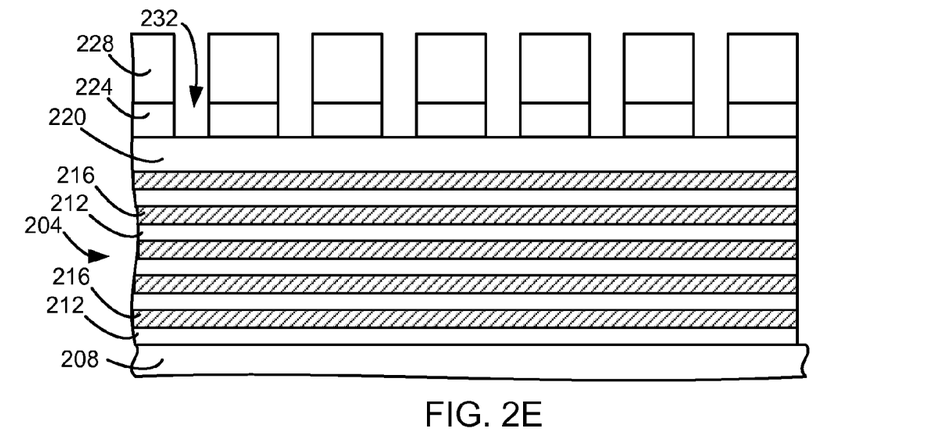
Figure 6:
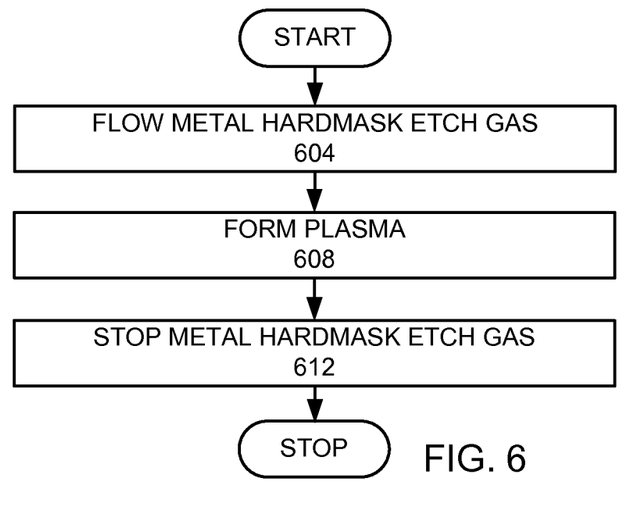
FIG. 6 is a more detailed flow chart of a process of etching the metal hardmask that may be used in an embodiment of the invention.

Within the plasma processing system 400, the metal containing hardmask 224 is etched (step 308). FIG. 6 is a more detailed flow chart of a process for etching the metal containing hardmask 224. A metal hardmask etch gas is flowed into the plasma processing chamber 404 (step 604). In this example the metal hardmask etch gas is a combination of F and Cl containing halogen gases mixed with O2, Ar, N2 and He. Halogen gases could be $SF_6$, $NF_3$, $Cl_2$, $CH_2F_2$, or $C_4F_6$. The metal hardmask etch gas is formed into a plasma (step 608). In this example, a pressure in the range of 5-50 mT is provided. Source power from 500-2000 W is provided to form the etch gas into a plasma. A bias voltage of 100-1000 V is provided. The flow of the metal hardmask etch gas is stopped (step 612). FIG. 2E is a cross sectional view of the stack 204 after features 232 have been etched into the metal containing hardmask 224.

Figure 2F:
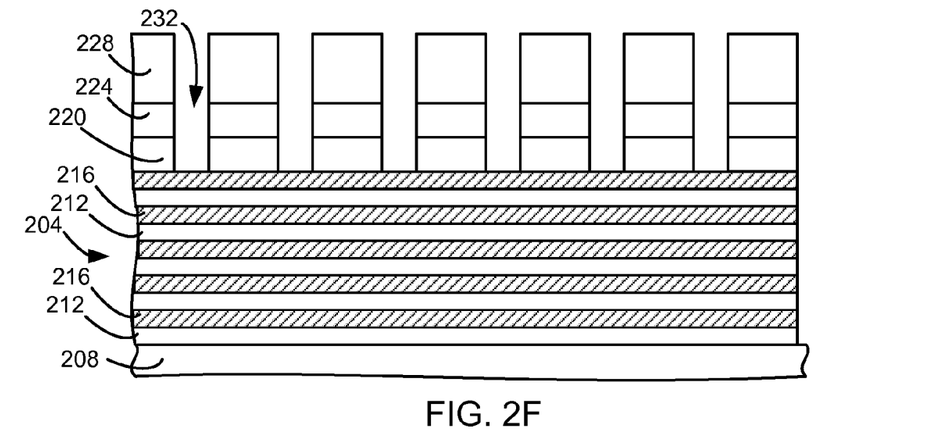
Figure 7:
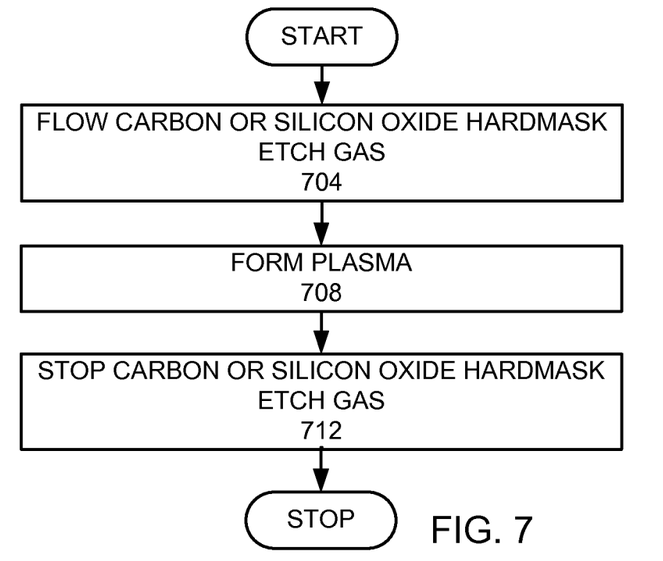
FIG. 7 is a more detailed flow chart of a process of etching the carbon or silicon oxide hardmask that may be used in an embodiment of the invention.

The carbon or silicon oxide containing hardmask 220 is etched (step 312). FIG. 7 is a more detailed flow chart of a process for etching the carbon or silicon oxide containing hardmask 220. A carbon or silicon oxide containing hardmask etch gas is flowed into the plasma processing chamber 404 (step 704). In this example the carbon or silicon oxide containing hardmask etch gas is $CF_4$, $CH_2F_2$, $C_4F_6$, $NF_3$, $SF_6$, Ar, He, and $O_2$. The carbon or silicon oxide containing hardmask etch gas is formed into a plasma (step 708). In this example, a pressure in the range of 5-50 mT is provided. Source power from 500-2000 W is provided. A bias voltage 100-1000 V is provided. The flow of the carbon or silicon oxide containing hardmask etch gas is stopped (step 712). FIG. 2F is a cross sectional view of the stack 204 after features 232 have been etched into the carbon or silicon oxide containing hardmask 220.

Figure 2G:
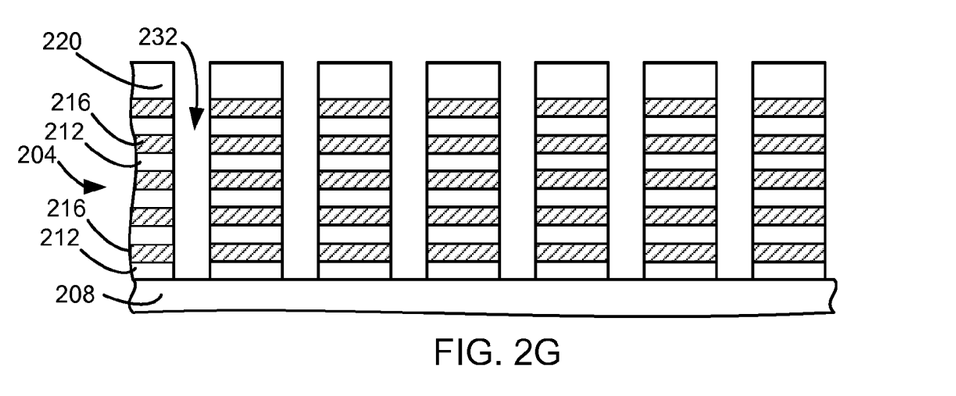

The stack 204 is etched through the patterned hardmasks (step 120). An example of a recipe for etching the stack 204 is provides an etch gas comprising $C_xH_yF_z$, HBr, He, and Ar, if the stack is OPOP, where x, y, and z are whole numbers. If the stack is ONON, then the etch gas comprises $C_xH_yF_z$, Ar, and He. FIG. 2G is a cross sectional view of the stack 204 after features 232 have been etched into the stack 204. In this embodiment, during the etching of the stack 204 (step 120), the metal containing hardmask 224 is consumed and the carbon or silicon oxide containing hardmask 220 acts as the mask during the remainder of the etching of the stack 204.

Other processes are used to further form the devices. Such processes may include a wet etch that cleans redeposited metal residue. In addition, if the carbon or silicon oxide containing hardmask 220 is carbon, then an ashing step may be used to remove the carbon or silicon oxide containing hardmask 220. Such an ashing process would be less damaging to the stack 204 than a process required to remove the metal containing hardmask 224, if the metal containing hardmask 224 were not removed during the etch.

This embodiment of the invention increases both the vertical and radial selectivity of the overall mask. The selectivity may be increased by 3 to 4 times. Radial selectivity is a function of faceting of the mask. As the faceting of the mask increases, the width or radial dimension of the etched feature increases. Therefore, to increase radial selectivity, mask faceting should be reduced. In this embodiment, the metal containing hardmask 224 provides the improved selectivity with respect to etching the stack 204. The carbon or silicon oxide containing hardmask 220 acts as a primary buffer during the etching of the stack 204 by absorbing the sputtered redeposition of the metal containing hardmask 224 during the etching of the stack 204. The sputtering is mainly from horizontal surfaces of the metal containing hardmask 224. Because the carbon or silicon oxide containing hardmask 220 absorbs redeposited sputtered metal from the metal containing hardmask 224, the resistance to etching of the carbon or silicon oxide containing hardmask 220 increases because the sidewalls of the carbon or silicon oxide containing hardmask 220 are impregnated with metal, which further improves selectivity. In addition, since the carbon or silicon oxide containing hardmask 220 absorbs redeposited sputtered metal, the carbon or silicon oxide containing hardmask 220 reduces or eliminates sputtered metal from reaching sidewalls of the stack 204, which reduces or eliminates sputtered metal contamination of the stack 204.

In other embodiments, the stack 204 may be a plurality of alternating layers of, alternating stacks of silicon oxide and silicon nitride (ONON), alternating stacks of silicon oxide and polysilicon (OPOP), or a single material such as silicon oxide. The stacks 204 may be used for different uses, such as 3D memory, a 3D NAND, or a DRAM capacitor. The carbon or silicon oxide containing hardmask 220 may have a metal dopant. In some embodiments of the invention, in the creation of high aspect ratio features, the stacks 204 may have more than 70 alternating layers. More preferably, the stacks 204 have more than 100 alternating layers. In other embodiments, the metal containing hardmask is made of TiOx, W (such as WOx, WN, or WC), or Ta (such as TaN or TaOx).

For etching the metal containing hardmask 224 generally a fluorine or halogen based etch gas is used to provide a chemical etch. Such an etch may alternate an etch phase with a passivation phase. For etching a carbon hardmask 220, an oxygen based chemical etch is used. In addition to oxygen, COS or $SO_2$ are added to the etch gas as a passivant. The etching of the stack 204 may also be a chemical etch, such as a halogen etch, with a high energy or bias plasma to etch high aspect ratio features. Preferably, such etches are not bombardment type etches. The metal containing hardmask 224 may be elemental metal, an alloy, a metal oxide, metal nitride, or metal carbide. For etching a stack 204 with silicon oxide, preferably the carbon or silicon oxide containing stack hardmask 220 is made of carbon. If the stack 204 does not contain silicon oxide, then the carbon or silicon oxide hardmask 220 may be silicon oxide. Preferably, the patterned mask 228 is used to etch both the metal containing hardmask 224 and the carbon or silicon oxide containing hardmask 220. However, in other embodiments, the patterned mask 228 may be used to etch the metal containing hardmask 224, and the metal containing hardmask 224 may be used to etch the carbon or silicon oxide containing mask 220. Such an embodiment might degrade the metal containing hardmask 224 while opening the carbon or silicon oxide containing hardmask 220.

Figure 8A:
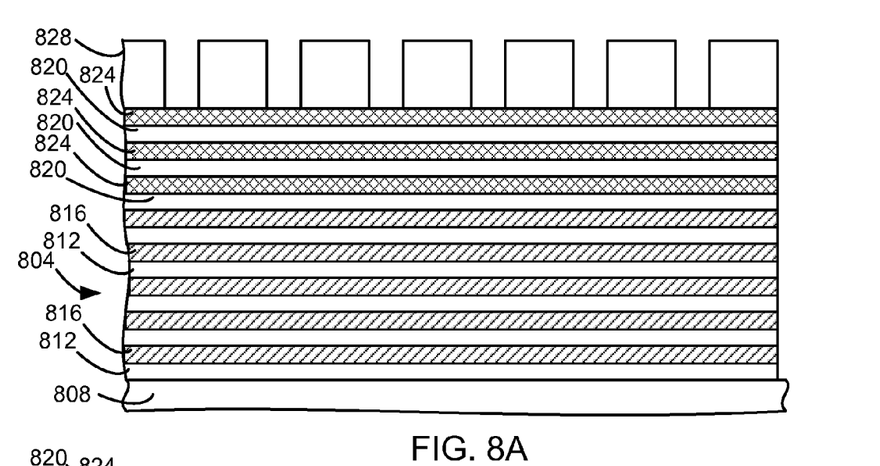
FIGS. 8A-C are schematic cross-sectional views of a memory stack formed according to another embodiment of the invention.

In another embodiment of the invention, the steps of forming a carbon or silicon oxide hardmask (step 108) and forming a metal hardmask (step 112) are cyclically repeated a plurality of times to form a plurality of alternating layers of carbon or silicon oxide hardmasks and metal hardmasks. FIG. 8A is a cross sectional view of the stack 804 after a plurality of alternating carbon or silicon oxide containing hardmasks 820 and metal containing hardmasks 824 have been formed.

Figure 8B:
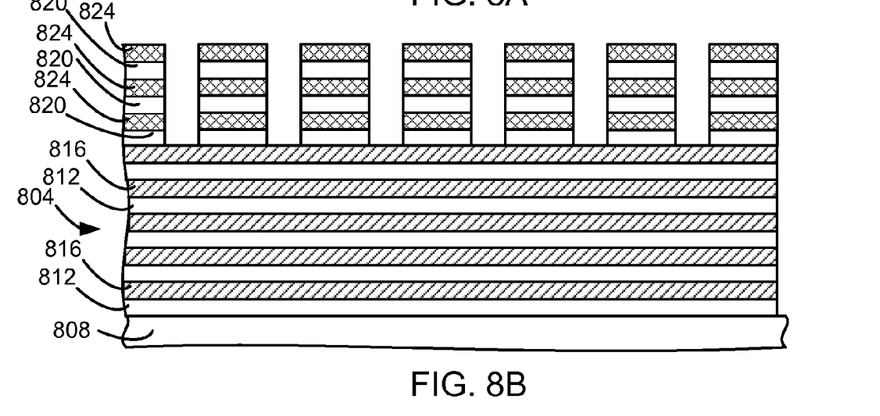

To pattern the hardmasks (step 116), as in the previous embodiment, a patterned mask 828 may be formed (step 304). The steps of etching the metal containing hardmask 824 (step 308) and etching the carbon or silicon oxide containing hardmask 820 (step 312) are cyclically repeated a plurality of times. FIG. 8B is a cross sectional view of the stack 804 after the plurality of alternating carbon or silicon oxide containing hardmasks 820 and metal containing hardmask 824 have been etched using a plurality of cycles of alternating etching the metal containing hardmask 824 (step 308) and etching the carbon or silicon oxide containing hardmask 820 (step 312). In this example, the patterned mask 828 is removed during the etching of the patterning the hardmasks.

Figure 8C:
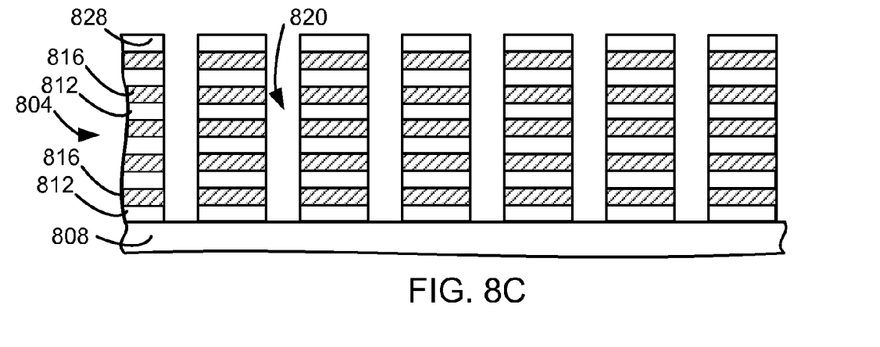

The stack 804 is etched through the hardmasks (step 120). The process used in the previous embodiment may be used to etch the stack 804 or other processes may be used. FIG. 8C is a cross sectional view of the stack 804 after features 820 have been etched into the stack 804.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in a stack, comprising:
   forming a combination hardmask, comprising;
     forming a first hardmask layer comprising carbon or silicon oxide over the stack;
     forming a second hardmask layer comprising metal over the first hardmask layer;
     forming a third hardmask layer comprising carbon or silicon oxide over the second hardmask layer, and
     forming a fourth hardmask layer comprising metal over the third hardmask layer;
   etching the fourth hardmask layer, comprising:
     flowing a fourth hardmask layer etch gas comprising a halogen component; and
     forming the fourth hardmask layer etch gas into a plasma; and
     stopping the flow of the fourth; and
   etching the third hardmask layer, comprising:
     flowing a third hardmask layer etch gas comprising oxygen and at least one of COS or $SO_2$;
     forming the first hardmask layer etch gas into a plasma; and
     stopping the flow of the first hardmask layer etch gas;
   patterning the first and second hardmask layers; and
   etching the stack through the combination hardmask.

2. The method, as recited in claim 1, wherein the second hardmask comprises at least one of elemental metal, a metal alloy, a metal oxide, metal carbide, or a metal nitride.

3. The method, as recited in claim 1, wherein the stack is at least one of a silicon oxide layer, OPOP or ONON.

4. The method, as recited in claim 1, further comprising ashing the first hardmask layer.

5. The method, as recited in claim 1, wherein the patterning the first and second hardmask layers comprises:
forming a patterned mask over the hardmask layers;
etching the second hardmask layer; and
etching the first hardmask layer.

6. The method, as recited in claim 5, wherein the patterning the first and second hardmask layers comprises:
etching the second hardmask layer, comprising:
flowing a second hardmask layer etch gas comprising a halogen component;
forming the second hardmask layer etch gas into a plasma; and
stopping the flow of the second hardmask layer etch gas; and
etching the first hardmask layer, comprising:
flowing a first hardmask layer etch gas comprising oxygen and at least one of COS or $SO_2$;
forming the first hardmask layer etch gas into a plasma; and
stopping the flow of the first hardmask layer etch gas.

7. The method, as recited in claim 6, wherein the patterning the hardmask layers removes the patterned mask.

8. The method, as recited in claim 5, wherein the etching the second hardmask layer, comprises:
flowing a second hardmask layer etch gas comprising a halogen component;
forming the second hardmask layer etch gas into a plasma; and
stopping the flow of the second hardmask layer etch gas; and wherein etching the first hardmask layer, comprises:
flowing a first hardmask layer etch gas comprising oxygen and at least one of COS or $SO_2$;
forming the first hardmask layer etch gas into a plasma; and
stopping the flow of the first hardmask layer etch gas.

9. The method, as recited in claim 8, wherein the second hardmask comprises at least one of elemental metal, a metal alloy, a metal oxide, metal carbide, or a metal nitride.

10. The method, as recited in claim 9, wherein the stack is at least one of a silicon oxide layer, OPOP or ONON.

11. A method for etching features in a stack, wherein the stack is at least one of a silicon oxide layer, OPOP or ONON, comprising:
forming a combination hardmask, comprising;
forming a first hardmask layer comprising carbon or silicon oxide over the stack;
forming a second hardmask layer comprising metal over the first hardmask layer, wherein the second hardmask layer comprises at least one of elemental metal, a metal alloy, a metal oxide, metal carbide, or a metal nitride;
forming a third hardmask layer comprising carbon or silicon oxide over the second hardmask layer;
forming a fourth hardmask layer comprising metal over the third hardmask layer;
forming a patterned mask over the hardmask layers;
etching the fourth hardmask layer through the patterned mask, comprising:
flowing a fourth hardmask layer etch gas comprising a halogen component; and
forming the fourth hardmask layer etch gas into a plasma, and
stopping the flow of the fourth; and
etching the third hardmask layer, comprising:
flowing a third hardmask layer etch gas comprising oxygen and at least one of COS or $SO_2$;
forming the first hardmask layer etch gas into a plasma; and
stopping the flow of the first hardmask layer etch gas; and
patterning the first and second hardmask layers, wherein the patterning the first and second hardmask layers comprises:
etching the second hardmask layer, comprising
flowing a second hardmask layer etch gas comprising a halogen component;
forming the second hardmask layer etch gas into a plasma; and
stopping the flow of the second hardmask layer etch gas; and
etching the first hardmask layer, comprising;
flowing a first hardmask layer etch gas comprising oxygen and at least one of COS or $SO_2$;
forming the first hardmask layer etch gas into a plasma; and
stopping the flow of the first hardmask layer etch gas;
etching the stack through the combination hardmask.

12. The method, as recited in claim 11, wherein the patterning the hardmask layers removes the patterned mask.

13. The method, as recited in claim 12, further comprising ashing the first hardmask layer.

14. A method for etching features in a stack, comprising:
forming a combination hardmask, comprising;
forming a first hardmask layer comprising carbon or silicon oxide over the stack;
forming a second hardmask layer comprising metal over the first hardmask layer; and
forming a patterned mask over the second hardmask layer;
etching the second hardmask layer through the patterned mask, comprising:
flowing a second hardmask layer etch gas comprising a halogen component;
forming the second hardmask layer etch gas into a plasma; and
stopping the flow of the second hardmask layer etch gas;
etching the first hardmask layer, comprising:
flowing a first hardmask layer etch gas comprising oxygen and at least one of COS or $SO_2$;
forming the first hardmask layer etch gas into a plasma; and
stopping the flow of the first hardmask layer etch gas; and
etching the stack through the combination hardmask.

15. The method, as recited in claim 14, wherein the second hardmask comprises at least one of elemental metal, a metal alloy, a metal oxide, metal carbide, or a metal nitride.

16. The method, as recited in claim 14, wherein the stack is at least one of a silicon oxide layer, OPOP or ONON.

* * * * *